United States Patent [19]

Vale et al.

[11] 3,973,149
[45] Aug. 3, 1976

[54] DEVICES USING PIEZOELECTRIC $Tl_3BX_4$ COMPOUNDS

[75] Inventors: Christopher R. Vale, Elkridge, Md.; Thelma J. Isaacs, Murrysville, Pa.

[73] Assignee: Westinghouse Electric Corporation, Pittsburgh, Pa.

[22] Filed: Jan. 10, 1975

[21] Appl. No.: 540,195

[52] U.S. Cl. .................................. 310/9.5; 310/8; 310/8.2; 333/72; 333/30 R
[51] Int. Cl.² .................................. H01L 41/18
[58] Field of Search ............... 310/8, 8.1, 8.2, 9.5, 310/9.8; 333/72, 30 R; 252/62.6

[56] References Cited
UNITED STATES PATENTS 3,771,072  11/1973  Slobodnik, Jr. ................. 310/9.5 X
3,772,618  11/1973  Slobodnik, Jr. ................. 310/9.5 X

*Primary Examiner*—Mark O. Budd
*Attorney, Agent, or Firm*—R. D. Fuerle

[57] ABSTRACT

A crystal resonator is disclosed of a single crystal of the approximate composition $Tl_3BX_4$ having two parallel surfaces normal to a zero temperature coefficient of frequency direction and having an electrode mounted on each surface, where B is vanadium, niobium, or tantalum, and X is sulfur or selenium. A filter is disclosed of a crystal resonator coupled to a capacitor or more than one crystal resonator in series each coupled to a capacitor. A voltage controlled crystal oscillator resonator is disclosed of a crystal resonator in parallel with an inductor and a varactor.

33 Claims, 6 Drawing Figures

DEVICES USING PIEZOELECTRIC Tl₃BX₄ COMPOUNDS

CROSS REFERENCE TO RELATED APPLICATIONS

This application is related to application Ser. No. 540,194, filed of even date by R. W. Weinert and T. J. Isaacs titled "Crystals Having Zero Temperature Coefficients of Delay."

This application is related to application Ser. No. 540,192, filed of even date by Thelma J. Isaacs and Milton Gottlieb titled "Tl₃TaS₄ and Tl₃TaSe₄ Crystals and Acousto-Optical Devices."

This application is also related to application Ser. No. 540,193, filed of even date by T. J. Isaacs and R. W. Weinert titled "Acoustic Surface Wave Devices Using Tl₃TaS₄ and Tl₃TaSe₄ Crystals."

This application is related to application Ser. No. 392,695, filed Aug. 29, 1973 by Thelma J. Isaacs, Milton Gottlieb, John D. Feichtner and Andrea A. Price, titled "Tl₃VS₄ and Tl₃NbS₄ Crystals and Acousto-Optical Devices." That application claims single crystals of $Tl_3VS_4$, $Tl_3NbS_4$, and non-conducting mixtures thereof, and acousto-optical systems and an acoustic delay line using the single crystals.

This application is also related to application Ser. No. 463,337, filed Apr. 23, 1974 by T. J. Isaacs and M. R. Daniel titled "Acoustic Surface Wave Device." That application describes surface wave devices which use crystals of $Tl_3VS_4$, $Tl_3NbS_4$, or mixtures thereof.

BACKGROUND OF THE INVENTION

A resonator is a device which passes only a single frequency or a small band of frequencies out of a large band of frequencies submitted to it. A measurement of the suitability of a material as a crystal resonator is its quality factor, Q, which is equal to $f_o/\Delta f$ where $f_o$ is the center frequency passed by the resonator and $\Delta f$ is the 3db bandwidth passed. Only piezoelectric resonators have the high Q values and small size required for most modern electronic devices.

In addition to a high Q value, a piezoelectric resonator should be physically stable and should pass the same frequency as it ages (time stability). Another very important property is the ability of the resonator to pass the same frequency in spite of changes in its temperature. So far, the best material appears to be quartz, which is the most widely used material for piezoelectric resonators.

Quartz has excellent physical stability and a high Q value (up to $10^6$). Moreover, quartz is unique in that over a limited temperature range the frequency of the passed signal stays almost constant. However, quartz has another property which is very undesirable, a high $C_0/C_1$ ratio of about 250.

Referring to FIG. 1, an electrical schematic, the drawing shows the electrical equivalent of a crystal resonator. In the drawing a capacitor $C_1$, an inductance $L_1$, and a resistance $r_1$ in series are connected in parallel to a capacitance $C_0$. Ideally $C_0$ (and $r_1$) would be zero, but in practical crystal resonators $C_0$ is never zero and therefore the ratio $C_0/C_1$ is not zero. The $C_0/C_1$ ratio is related to the physical properties of the material used in the crystal resonator according to the formula $C_0/C_1 = (\pi k q_o)/(32\epsilon^2)$ where $k$ is the effective dielectric constant, $q_o$ is the stiffness, and $\epsilon$ is the piezoelectric constant. The value of $C_0$ is determined by the formula $C_0 = \epsilon_o \epsilon_R A/T$ where $\epsilon_0$ is the permeativity of free space, $\epsilon_R$ is the relative dielectric constant of the crystal, $A$ is the area of the electrode, and $T$ is the crystal thickness. The consequences of a large $C_0/C_1$ ratio are shown in FIG. 2.

FIG. 2 is a graph showing the relationship between the amplitude of the electrical signal passed at various frequencies by a crystal resonator. The solid line shows the amplitudes of the signals for a crystal resonator with a large $C_0/C_1$ ratio such as a quartz resonator and the dotted line shows the amplitudes for a crystal resonator with a small $C_0/C_1$ ratio. The drawing indicates that for a material such as quartz an anti-resonance occurs at a frequency, $f_1$, very near $f_o$, the center frequency, and at $f_1$ no signal is passed. The separation, $\Delta f_p$, is equal to $\frac{1}{2} f_o C_1/C_0$ and therefore materials with a low $C_0/C_1$ ratio have a greater $\Delta f_p$ as shown by the dotted line.

The result of using crystal resonators having a large $C_0/C_1$ ratios in a filter is shown in FIG. 3, a graph of amplitude against frequency for a wideband filter, such as one made from quartz resonators. A wideband filter contains crystal resonators in the circuit, but passes a wider range of frequencies. FIG. 3 shows that if the $C_0/C_1$ ratio is large there will be a frequency $f_1$ in the middle of the band which is not passed. If a material is used in the filter which has a small $C_0/C_1$ ratio the gap in the middle of the band vanishes. (Efforts have been made to find other suitable resonator materials which have a low $C_0/C_1$ ratio. For example, both piezoceramic (barium titanate and related materials), and lithium tantalate have lower $C_0C_1$ ratios, (about 25 for piezoceramic and about 20 for $LiTaO_3$) but piezoceramic has poor time and temperature stability and lithium tantalate has poor physical and temperature stability.)

Finally, while narrow band filters can be made from quartz resonators by simply connecting the resonators in series and coupling each resonator to a capacitor, wideband filters made from quartz resonators require considerably more complicated circuitry. Wideband resonators are needed for FM radios, high frequency TV, IF (intermediate frequency) transmission, radar, and pulse transmission circuits, and a simpler circuitry would be less expensive.

PRIOR ART

An article entitled "Magnetic Susceptibility of Ternary Compounds $Tl_3VS_4$ and $Tl_3TaS_4$" by M. Matzas and K. Cermak appears on pages 1305 and 1306 of the Czechoslovakian Journal of Physics (1969).

An article entitled "Luminescence Spectra of Ternary Compounds of $Tl_3BX_4$ Type" by M. A. Goryanora, V. M. Orlov, W. L. Sokolova, E. V. Tsvetkova, and Yu. G. Shreter appears on pages K127 and K128 of Physics Status Solidi (1972).

An article entitled "Width Of The Energy Gap Of Some Ternary Thallium Chalcogenides" by K. Cermak appears on pages 3605 to 3609 of Collection Czechoslov. Chem. Commun., Vol. 34 (1969).

An article entitled "Switching Effect in Crystalline $Tl_3VS_4$" by L. N. Antipova, B. V. Belyaev, V. A. Gor'kov, and V. P. Rombakh appears in Soviet Physics — Semiconductors, Vol. 6, No. 12, June, 1973.

An article entitled "Some Ternary Thallium Chalcogenides" C. Crevecoeur appears in the January–June 1964 volume (Volume No. 17) of Acta Crystallographica on page 757. That article describes the preparation and characteristics of the isomorphous compounds $Tl_3VS_4$, $Tl_3NbS_4$, $Tl_3TaS_4$, $Tl_3VSe_4$, $Tl_3NbSe_4$, and $Tl_3TaSe_4$.

SUMMARY OF THE INVENTION

We have discovered that crystal resonators made from single crystals of the approximate composition $Tl_3BX_4$, where B is vanadium, niobium, or tantalum, and X is sulfur or selenium, are superior to quartz resonators in several important ways. First, although testing has not yet been completed, the $C_0/C_1$ ratio (i.e., the coupling coefficient) of these crystal resonators is expected to be about 10 times lower than the ratio for quartz. The ratio is expected to be low enough to eliminate the gap of non-passed frequencies which appears in FIG. 3.

Also, due to the low $C_0/C_1$ ratio of these crystal resonators, they can pass a wideband of frequencies without the need for complicated circuitry. The range of output frequencies in the voltage controlled crystal oscillator is also larger.

The resonator crystals of this invention possess bulk zero temperature coefficient of frequency (ZTCF) directions. That is, the crystals can be aligned so that the frequency passed by the crystal resonator remains almost constant over a limited temperature range, a property until now unique to quartz. Moreover, the crystals have this property at a range of temperatures around room temperature, which is a very useful range. This property is a great advantage in that it is much easier to keep the frequency passed constant.

Finally, the crystal resonators of this invention are physically stable and are frequency stable over a period of time.

DESCRIPTION OF THE INVENTION

Figure 1:
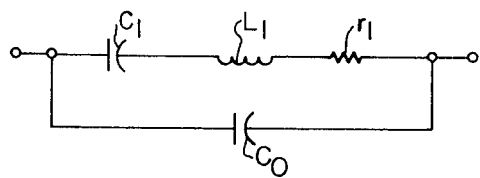
FIG. 1 is an electrical schematic of the electrical equivalent of a crystal resonator.

In FIG. 1, a capacitor $C_1$, and inductor $L_1$, and a resistor $r_1$ in parallel are connected in series to a capacitor $C_0$. This arrangement is the electrical equivalent of a crystal resonator.

Figure 2:
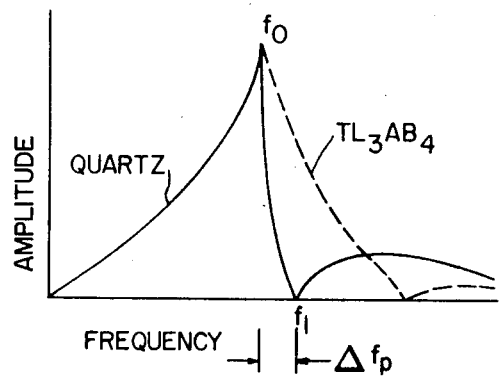
FIG. 2 is a graph of frequency versus amplitude for two crystal resonators.

In FIG. 2, the solid line shows the behavior of a quartz resonator and the dotted line show the expected behavior of the $Tl_3BX_4$ resonators of this invention.

Figure 3:
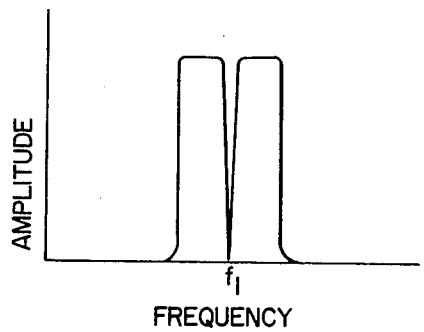
FIG. 3 is a graph of frequency versus amplitude for a quartz filter.

In FIG. 3 a gap appears in the band of frequencies passed by a quartz filter.

Figure 4:
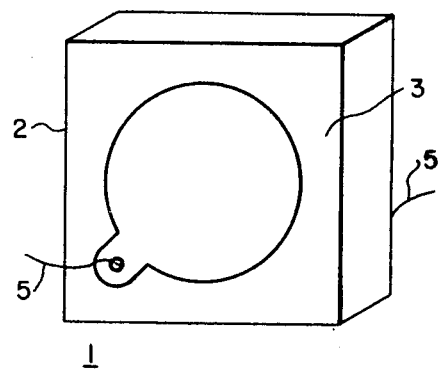
FIG. 4 is an isometric drawing of a crystal resonator according to this invention.

In FIG. 4 crystal a resonator 1 consists of a single crystal 2, of $Tl_3BX_4$ with two parallel faces 3 (opposite face not shown). On each face is mounted an electrode 4 (opposite electrode not shown) to which is attached a lead 5. The parallel faces 3 of crystal 2 should be at least about 5mm in diameter in order to be useful in a crystal resonator at the present level of technology. However, advances in technology may make it possible to use smaller crystals. The thickness of the crystal determines the frequency passed according to the formula $T = \lambda/4 = V_B/(4f_0)$ where $\lambda$ is the output wavelength, $V_B$ is the bulk wave velocity and $T$ is the crystal thickness. The crystal resonator can also be operated at overtones (e.g., $T = 3\lambda/4$). A practicel thickness range is about 0.03 to about 0.9mm, and an $f_0$ of about 5 to about 35MHz is believed possible. The crystal is preferably aligned so that a zero temperature coefficient of frequency direction is normal to the two surfaces. The electrodes may be vapor deposited gold, aluminum, or other conductor. The area of the electrode (and to a smaller extent its thickness) determines the value of $C_1$ in FIG. 1.

Figure 5:
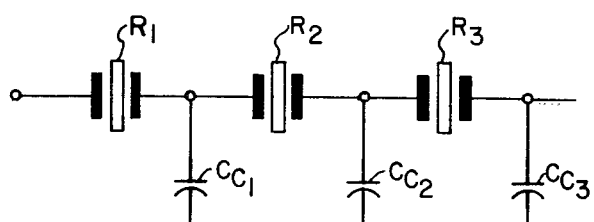
FIG. 5 is an electrical schematic of a filter according to this invention.

In FIG. 5, a filter 6 consists of crystal resonators $R_1$, $R_2$, $R_3$, etc. coupled by capacitors $C_1$, $C_2$, $C_3$, etc. The number of resonators used determines how sharply the filter discriminates between frequencies passed and not passed. About 1 to about 20 resonators is a practical number of resonators; more than 20 resonators are usually too expensive for most purposes and does not provide much additional discrimination. The bandwidth of the filter $\Delta f_3$, (at 3 decibels) is determined by the formula $\Delta f_3 = C_1 f_0/(C_c K)$ where $C_c$ is the capacity of the coupling capacitors and $K$ is a design constant. The capacity of the coupling capacitors has not yet been precisely determined, but is expected to be between about 200 and about 2000 pf. Below 200 pf the amplitude-frequency output curve may become multi-model and above 2000 pf the bandwidth may narrow. At about 200 pf the bandwidth is wide, about 100 KHz, and at about 2000 pf the bandwidth is narrow, about 10 KHz. The value of these coupling capacitors is about 5 to about 15 as large as the capacitance of coupling capacitors for quartz filters. Although every capacitor in the filter is preferably of equal value, design considerations may require unequal values. Fixed capacitors are preferred as variable capacitors are large, expensive, unreliable, and must be tuned.

Figure 6:
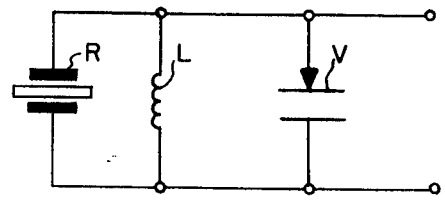
FIG. 6 is an electrical schematic of a voltage controlled crystal oscillator (VCXO) resonator according to this invention.

In FIG. 6, a voltage controlled crystal oscillator resonator (VCXO), consists of a crystal resonator, R, in parallel with an inductor L, and a varactor V, (i.e., a voltage variable capacitor). The VCXO produces a signal the gross frequency of which is controlled by the thickness of the crystal in the resonator and the bulk wave velocity in the crystal according to the formula $f_0 = V_R/(4T)$ where $V_R$ is the bulk wave velocity in the crystal and $T$ is the crystal thickness. The range R, of frequencies over which the voltage in the varactor can draw the resonator is determined by the formula $R = f_0 C_1/(2C_v)$ where $C_v$ is the voltage controlled capacity of the varactor. The range for the VCXO of this invention is larger than for a quartz VCXO because $C_1$ is larger. The value of the inductor L, in the VCXO is selected to resonate with $C_0$ in the crystal resonator according to the formula $L = 1/(4\pi^2 f_0^2 C_0)$. A practical range for the voltage of the varactor is about 1 to about 20 volts, and for the capacitance of about 0.5 to about 30 pf.

The VCXO can be used in Doppler radar and in sweep signal generators.

THE CRYSTALS

The crystals used in this invention have the approximate composition $Tl_3BX_4$ where B is vanadium, niobium, or tantalum, and X is sulfur or selenium. Mixtures of the crystals (e.g., $Tl_3VS_2Se_2$) are also contemplated, although they may not be as easily grown as unmixed crystals. The preferred crystals are $Tl_3VS_4$ and $Tl_3TaS_4$, especially the latter, due to their high $C_0/C_1$ ratios. The ideal crystal compositions (i.e., the compositions of maximum stability and properties) are not known, but may be non-stoichiometric. Therefore, crystals within about 5% of stoichiometric are contemplated within the scope of this invention.

The compounds used to prepare the crystals of this invention may be prepared from very pure quantities of the elements involved. First, the thallium is washed in hot distilled water and the tantalum, vanadium, and niobium in dilute mineral acid to remove oxides which may interfere with crystal growth. Then the elements are mixed and melted together in evacuated containers until they react to form the compound. Several days of heating the melt may be required. The temperature of the melt must be maintained considerably above the melting point (e.g., at 800° to 1000°C) in order for a complete reaction to occur within a reasonable period of time (e.g., a few days).

A crystal may be prepared by the Stockbarger technique by sealing the compound in a silica glass tube under argon, melting it, and lowering it very slowly (10 to 15 mm/day) through a two-zone furnace having a steep temperature gradient (8° to 14°C/mm) at its melting point. The crystals are then orientated, cut, ground, and polished.

Details and examples of crystal preparation can be found in the cross-referenced applications, herein incorporated by reference.

The crystals of this invention are piezoelectric and cubic. They have the CsCl structure, $I\bar{4}3m$, with two formula units per unit cell, and their diffraction aspect derived from X-ray data is I***.

EXAMPLE

A composition was prepared by first washing a quantity of thallium in distilled water and tantalum and vanadium in dilute mineral acid, then weighing out very precise amounts of the required elements:

| Composition | Element (grams) | | |
|---|---|---|---|
| | Tl | V | S |
| $Tl_3VS_{4.02}$ | 12.2622 | 1.0188 | 2.5778 |

The elements for the composition were placed in a silica-glass ampoule which was sealed under vacuum. The ampoule was heated to between 950° and 1000°C and held at that temperature for several days, with intermittent shaking throughout the period. After cooling, the compound was placed in a crystal-growing tube and sealed under 0.8 atmospheres of pure, dry argon gas. The tube was heated above the melting point of the compound (about 505 ± 5°C) and lowered through a temperature gradient of 8° to 14°C/mm at the melting point at a rate of 17mm/day. The crystal was about 0.8 cm by 0.8 cm by 2.5 cm. It was orientated, cut, and polished.

The resulting crystal was a rod 1 cm long and about 0.6 cm square. Quartz transducers were glued to each flat, parallel end of the rod so that waves could be generated normal to the Z axis (i.e., in the 001 direction). The resonator was placed in an oven and standing shear-mode bulk waves were generated in the crystal. The temperature of the crystal was raised and the frequency of the wave was changed so that acoustic resonance was maintained over the temperature range. From this data the temperature coefficient of delay was calculated and was found to be −62 ppm (i.e., for each °C change in temperature the delay or frequency changes by −62 ppm).

The experiment was repeated after gluing the quartz transducers to the flat, parallel sides of the crystal so that the wave was propagated along a 110 direction with the shear wave polarized along a second 110 direction. This time the temperature coefficient of delay was +380 ppm.

Thus, a zero temperature coefficient of delay direction had to lie in between these two directions. A linear approximation of the zero direction was made and it was found to be about 13° from a 001 direction going towards a 110 direction, with the 13° rotation occuring in a plane perpendicular to a 110 direction. (The zero temperature coefficient of delay direction is equivalent to a zero temperature coefficient of frequency direction (ZTCF)). The temperature range over which the bulk zero temperature coefficient of frequency is expected to be displayed is about 0° to about 30°C.

Due to the symmetry of the crystals, for each bulk ZTCF direction there are other equivalent bulk ZTCF directions. Also, it is believed that other independent bulk ZTCF directions exist in the crystals. Because of the similarity of the $Tl_3VS_4$ crystal to the other crystals of the invention, the other crystals will also have bulk ZTCF directions.

In addition to the above-described crystal, large (i.e., $>0.5 \times 0.5 \times 1$ cm) single crystals of the following compositions were also grown: $Tl_3VS_4$, $Tl_3TaS_4$, $Tl_3TaSe_4$, $Tl_3VS_{4.01}$, $Tl_3TaS_2Se_2$, $Tl_3V_{0.95}S_4$, $Tl_3NbS_{4.02}$, $Tl_3Nb_{0.99}S_4$, $Tl_3TaS_{4.005}$, $Tl_3TaS_{4.02}$, and $Tl_3TaSe_{4.02}$. It should be noted that while the compositions given for the crystals are the compositions that the proportions of starting materials are expected to produce rather than the composition of the crystals as analyzed, the actual crystal compositions are believed to be within about 1% of the compositions given.

The coupling coefficient for surface waves for a crystal of $Tl_3TaS_4$ was measured as 3.5%. The bulk wave coupling coefficient for $Tl_3TaS_4$ and the other crystals of this invention is expected to be of the same order of magnitude. Since the $C_0/C_1$ ratio is inversely related to the coupling coefficient and the coupling coefficient for surface waves for quartz is about 0.18%, the $C_0/C_1$ ratios for the crystals of this invention are expected to be about 10 times less than the $C_0/C_1$ ratio for quartz.

We claim:

1. A crystal resonator comprising:
    A. a single crystal of the approximate composition $Tl_3BX_4$ within about ±5% of stoichiometric, having two parallel surfaces, where B is selected from the group consisting of vanadium, niobium, tantalum, and mixtures thereof, and X is selected from the group consisting of sulfur, selenium, and mixtures thereof, and
    B. an electrode mounted on each surface.

2. A crystal resonator according to claim 1 wherein said two parallel surfaces are normal to a zero temperature coefficient of frequency direction.

3. A crystal resonator according to claim 1 wherein said crystal has the composition $Tl_3VS_4$, within about ± 5% of stoichiometric.

4. A crystal resonator according to claim 3 wherein said surfaces are normal to a crystal direction of about 13° from a 001 direction going towards a 110 direction with the 13° rotation occurring in a plane perpendicular to a 110 direction.

5. A crystal resonator according to claim 1 wherein said crystal has the composition $Tl_3VSe_4$ within about ± 5% of stoichiometric.

6. A crystal resonator according to claim 1 wherein said crystal has the composition $Tl_3TaS_4$ within about ± 5% of stoichiometric.

7. A crystal resonator according to claim 1 wherein said crystal has the composition $Tl_3TaSe_4$ within about ± 5% of stoichiometric.

8. A crystal resonator according to claim 1 wherein said crystal has the composition $Tl_3NbS_4$ within about ± 5% of stoichiometric.

9. A crystal resonator according to claim 1 wherein said surface is at least about 5mm in diameter and the distance between said surfaces is about 0.03 to about 0.9mm.

10. A filter comprising at least one crystal resonator according to claim 1, in series if more than one, each crystal resonator being coupled by a capacitor.

11. A filter according to claim 10 wherein said capacitors are each about 200 to about 2000 pf.

12. A filter according to claim 10 wherein the number of said capacitors is about 1 to 20.

13. A filter according to claim 10 wherein said capacitors are fixed capacitors.

14. A method of filtering a wideband electrical signal comprising passing it through a filter according to claim 10.

15. A voltage controlled crystal oscillator resonator comprising a crystal resonator according to claim 1 in parallel with an inductor and a varactor.

16. A filter according to claim 10 wherein said two parallel surfaces are normal to a zero temperature coefficient of frequency direction.

17. A filter according to claim 10 wherein said crystal has the composition $Tl_3VS_4$, within about ±5% of stoichiometric.

18. A filter according to claim 17 wherein said surfaces are normal to a crystal direction of about 13° from a 001 direction going towards a 110 direction with the 13° rotation occurring in a plane perpendicular to a 110 direction.

19. A filter according to claim 10 wherein said crystal has the composition $Tl_3VSe_4$ within about ±5% of stoichiometric.

20. A filter according to claim 10 wherein said crystal has the composition $Tl_3TaS_4$ within about ±5% of stoichiometric.

21. A filter according to claim 10 wherein said crystal has the composition $Tl_3TaSe_4$ within about ±5% of stoichiometric.

22. A filter according to claim 10 wherein said crystal has the composition $Tl_3NbS_4$ within about ±5% of stoichiometric.

23. A filter according to claim 10 wherein said surface is at least about 5mm in diameter and the distance between said surfaces is about 0.03 to about 0.9mm.

24. A method according to claim 14 wherein the center frequency of said wideband electrical signal is about 5 to about 35 MHz.

25. A voltage controlled crystal oscillator resonator according to claim 15 wherein the voltage of said varactor is about 1 to about 20 volts and the capacitance of said varactor is about 0.5 to about 30 pf.

26. A voltage controlled crystal oscillator resonator according to claim 15 wherein said two parallel surfaces are normal to a zero temperature coefficient of frequency direction.

27. A voltage controlled crystal oscillator according to claim 15 wherein said crystal has the composition $Tl_3VS_4$, within about ±5% of stoichiometric.

28. A voltage controlled crystal oscillator resonator according to claim 27 wherein said surfaces are normal to a crystal direction of about 13° from a 001 direction going towards a 110 direction with the 13° rotation occurring in a plane perpendicular to a 110 direction.

29. A voltage controlled crystal oscillator resonator according to claim 15 wherein said crystal has the composition $Tl_3VSe_4$ within about ±5% of stoichiometric.

30. A voltage controlled crystal oscillator resonator according to claim 15 wherein said crystal has the composition $Tl_3TaS_4$ within about ±5% of stoichiometric.

31. A voltage controlled crystal oscillator resonator according to claim 15 wherein said crystal has the composition $Tl_3TaSe_4$ within about ±5% of stoichiometric.

32. A voltage controlled crystal oscillator resonator according to claim 15 wherein said crystal has the composition $Tl_3NbS_4$ within about ±5% of stoichiometric.

33. A voltage controlled crystal oscillator resonator according to claim 15 wherein said surface is at least about 5mm in diameter and the distance between said surface is about 0.03 to about 0.9mm.

* * * * *